United States Patent
Telfah et al.

(10) Patent No.: US 10,782,256 B2
(45) Date of Patent: Sep. 22, 2020

(54) NMR METHOD FOR DETECTING AND QUANTIFYING INDIVIDUAL ANALYTES IN LIQUID ANALYTE MIXTURES

(71) Applicant: Leibniz-Institut fuer Analytische Wissenschaften-ISAS-e.V., Dortmund (DE)

(72) Inventors: Ahmad Telfah, Dortmund (DE); Roland Hergenroeder, Dortmund (DE); Joerg Lambert, Senden (DE)

(73) Assignee: Leibniz-Institut fuer Analytische Wissenschaften-ISAS-e.V., Dortmund (DE)

( * ) Notice: Subject to any disclaimer, the term of this patent is extended or adjusted under 35 U.S.C. 154(b) by 0 days.

(21) Appl. No.: 16/468,713

(22) PCT Filed: Dec. 4, 2017

(86) PCT No.: PCT/EP2017/081314
§ 371 (c)(1),
(2) Date: Jun. 12, 2019

(87) PCT Pub. No.: WO2018/108600
PCT Pub. Date: Jun. 21, 2018

(65) Prior Publication Data
US 2020/0011816 A1   Jan. 9, 2020

(30) Foreign Application Priority Data
Dec. 13, 2016   (DE) .......... 10 2016 124 177

(51) Int. Cl.
*G01N 24/08*   (2006.01)
*G01R 33/46*   (2006.01)
*G01R 33/465*  (2006.01)

(52) U.S. Cl.
CPC .......... *G01N 24/08* (2013.01); *G01R 33/465* (2013.01); *G01R 33/4616* (2013.01)

(58) Field of Classification Search
CPC ... G01N 24/08; G01R 33/465; G01R 33/4616
See application file for complete search history.

(56) References Cited

U.S. PATENT DOCUMENTS

| 2011/0175614 A1 | 7/2011 | Carpenter et al. |
| 2012/0133358 A1* | 5/2012 | Broz .................... G01N 24/084 324/307 |

(Continued)

FOREIGN PATENT DOCUMENTS

WO   2016/189536 A1   12/2016

OTHER PUBLICATIONS

International Search Report in PCT/EP2017/081314, dated Feb. 27, 2018.

(Continued)

*Primary Examiner* — Gregory H Curran
(74) *Attorney, Agent, or Firm* — Collard & Roe, P.C.

(57) ABSTRACT

A method for detection and quantification of individual analytes in liquid analyte mixtures, by means of NMR spectrometry, in which method a sample of the analyte mixture has a high-frequency pulse applied to it in an NMR spectrometer, and the resulting NMR spectrum is evaluated, is to be developed further in such a manner that it allows a precise analysis of liquid analyte mixtures even when using low-field NMR spectrometers. For this purpose, the sample of the analyte mixture is placed into a low-field NMR spectrometer, and at least one high-frequency pulse that excites only one specific analyte is applied to it.

5 Claims, 5 Drawing Sheets

(56) References Cited

U.S. PATENT DOCUMENTS

Figure 1:
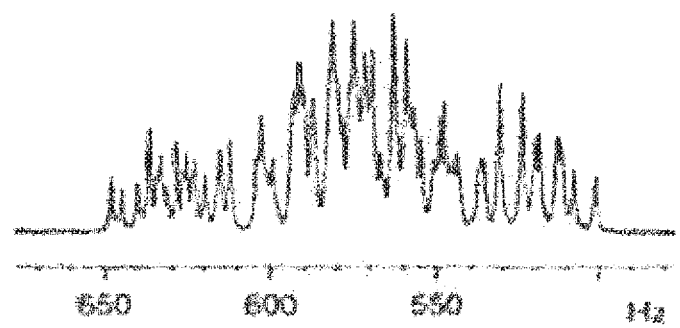

2016/0003753 A1\* 1/2016 Augustine ............ G01N 24/084
 324/309
2018/0340997 A1\* 11/2018 Ibragimova ........ G01R 33/3621

OTHER PUBLICATIONS

Freeman, "Shaped radiofrequency pulses in high resolution NMR", Journal of Progress in Nuclear Magnetic Resonance Spectroscopy 32 (1998) pp. 59-106.
B. Bluemich et al, "Mobile single-sided NMR", Progress in Nuclear Magnetic Resonance Spectroscopy 52 (2008) pp. 197-269.

\* cited by examiner

NMR METHOD FOR DETECTING AND QUANTIFYING INDIVIDUAL ANALYTES IN LIQUID ANALYTE MIXTURES

CROSS REFERENCE TO RELATED APPLICATIONS

This application is the National Stage of PCT/EP2017/081314 filed on Dec. 4, 2017, which claims priority under 35 U.S.C. § 119 of German Application No. 10 2016 124 177.6 filed on Dec. 13, 2016, the disclosure of which is incorporated by reference. The international application under PCT article 21(2) was not published in English.

The invention relates to a method for detection and quantification of individual analytes in liquid analyte mixtures, by means of NMR spectrometry, in which method a sample of the analyte mixture has a high-frequency pulse applied to it in an NMR spectrometer, and the resulting NMR spectrum is evaluated.

A precise analysis of liquid analyte mixtures is required or at least desirable in many application cases. High-resolution nuclear magnetic resonance spectroscopy (NMR) is fundamentally suitable for this purpose. However, such an NMR spectrometer, having a magnetic field intensity of more than 20 T (Tesla), is extremely cost-intensive and is therefore generally not available. Mass spectrometry is also fundamentally suitable for analysis. Such mass spectrometers are also complicated and cost-intensive, so that both of the aforementioned analysis instruments are not available for applications on location, for example in medical practices or also in security check systems at airports or the like.

However, it would be desirable, specifically in the sector of prediction, diagnosis, monitoring, and prognosis of illnesses, as well as in the optimization of medication dosage, to have a cost-advantageous on-site analysis method available. In this connection, analysis of the metabolism end products (metabolites) of a patient plays a key role. The concentrations of key metabolites in the bodily fluids of blood and urine fundamentally allow a differentiated prediction of the state of health and potential health risks.

However, the evaluation of a small number of biomarkers, such as triglycerides and cholesterol, which is practiced in present clinical analysis, is not sufficient to reliably predict the risk of occurrence of illnesses in every case. Such simple biomarker predictions underestimate the inherent complexity of metabolic disorders, which include hundreds of biochemical processes. However, drawing up a complete metabolic profile from bio-fluids has been out of the question in clinical analysis until now, for cost reasons. In contrast to the genome or proteome, which can be analyzed using cost-advantageous array technologies, comparably efficient and cost-advantageous diagnosis tools for the metabolome have not been available until now. As mentioned above, it is true that such analyses are fundamentally possible using mass spectrometers or high-resolution nuclear magnetic resonance spectrometers, but their use on site is not possible.

Inexpensive and portable low-field NMR spectrometers having a magnetic field intensity up to about 3 T are fundamentally also known. These low-field NMR spectrometers are increasingly coming onto the market and are used to measure the fat content of foods and as detectors for liquid chromatography. However, many of the portable NMR systems in use today have magnets with little homogeneity, and are therefore used for relaxometric tests to determine the water content of foods and for quality control of elastomers. There are commercial devices for traditional NMR spectroscopy tests, such as product inspection in organic synthesis, but these are only suitable for pure sample substances having well separated signals. These devices are usually used for training purposes and certainly achieve line widths that allow the resolution of multiplets. Low-field NMR spectrometers that are suitable for characterization of substance mixtures and, in this regard, particularly for clear detection and reliable quantification of the metabolites in blood and urine, have not been available until now, since spectral dispersion is much too small at low magnetic field intensities.

It is the task of the invention to further develop a method of the type described initially, in such a manner that it allows precise analysis of liquid analyte mixtures even when using low-field NMR spectrometers.

This task is accomplished, according to the invention, in the case of a method of the type indicated initially, in that the sample of the analyte mixture is placed into a low-field NMR spectrometer, and at least one high-frequency pulse that excites only one specific analyte is applied to it.

As previously mentioned, low-field NMR spectrometry is fundamentally not suitable for analysis of substance mixtures, for example for reliable quantification of the metabolites in blood and urine, since massive superimposition of metabolite signals and matrix signals occurs in the NMR spectra of bio-fluids, which signals make reasonable analysis impossible. For this reason, according to the invention, the usual high-frequency pulse is not applied to the respective sample of the analyte mixture in a low-field NMR spectrometer, but rather a high-frequency pulse that excites only one specific analyte is determined for the analyte being sought, in each instance, and only this analyte-specific high-frequency pulse is applied to the sample.

In this regard, according to the invention, an analyte-specific high-frequency pulse is understood to be a high-frequency pulse that is able to excite an entire series of frequency bands, specifically precisely at all positions at which signals appear in the NMR spectrum in the case of a specific analyte. In this way, only the corresponding analyte is excited, and if the same is present in the sample, the analyte can be clearly detected and quantified in the NMR spectrum. Thus, for example in the case of a security check at an airport or the like, a liquid sample can be analyzed in targeted manner in this way, for a specific analyte, in that only the high-frequency pulse that excites this specific analyte is applied to the sample. If the analyte can then be detected in the NMR spectrum, the sample contains this analyte; otherwise, the analyte is not contained in the sample.

In most application cases, it is preferably provided that the sample of the analyte mixture has multiple high-frequency pulses applied to it, one after the other, each pulse exciting only one specific analyte, wherein the resulting NMR spectrum is evaluated after every high-frequency pulse application. In contrast to traditional NMR spectrometry, therefore, not only one single high-frequency pulse is applied to the sample, but rather multiple high-frequency pulses are applied, one after the other, each exciting only one specific analyte, i.e. it is successively investigated whether or not the sample contains different analytes or analyte substances. Thereby precise analysis of substance mixtures, and, in this regard, in particular clear detection and reliable quantification of the metabolites in blood and urine, for example, is made possible with simple, cost-advantageous low-field NMR spectrometers.

In a preferred embodiment, it is provided that the magnetic field of the low-field NMR spectrometer has a magnetic intensity between 0.1 and 3.0 T. Such low-field NMR spectrometers are available and have a comparatively low cost expenditure, so that they can be used in medical practices or also at security check stations, for example.

To carry out the method, it is preferably provided that a high-frequency pulse that is specific to a respective analyte and excites only this analyte is determined and archived for a plurality of analytes. The respective high-frequency pulses are then stored in the memory of the respective low-field NMR spectrometer, and can be selected in accordance with the analyte being sought, and then applied to the sample.

To determine the respective high-frequency pulse, it is preferably provided that the respective high-frequency pulse, which excites only one specific analyte, is determined in numerically iterative manner. The high-frequency pulse can be calculated, for example, in accordance with the principle of what is called optimal monitoring. Thus, for example, a Krotov method can be used, which has proven to the best suitable algorithm for complex systems having many different hydrogen nuclei. The Krotov algorithm has a strictly monotonous convergence behavior and does not require any gradient techniques, which could lead to suboptimal solutions, for optimization of the high-frequency pulses.

Figure 12:
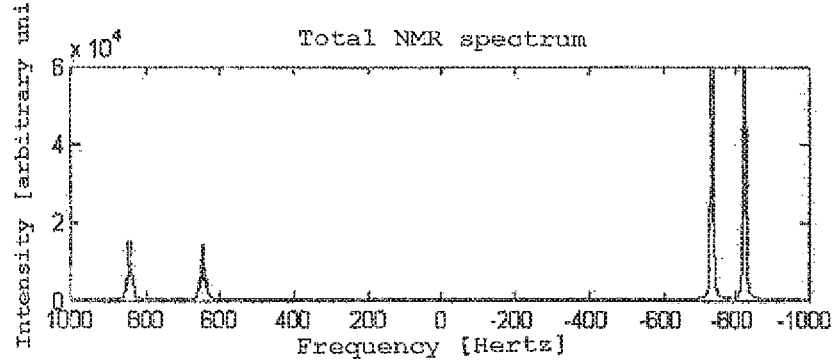
Figure 13:
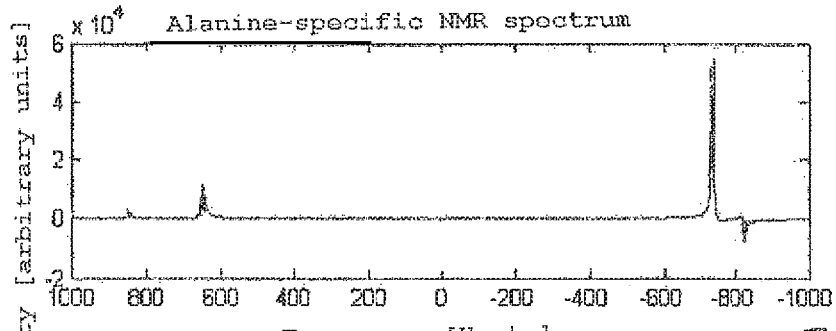
Figure 16:
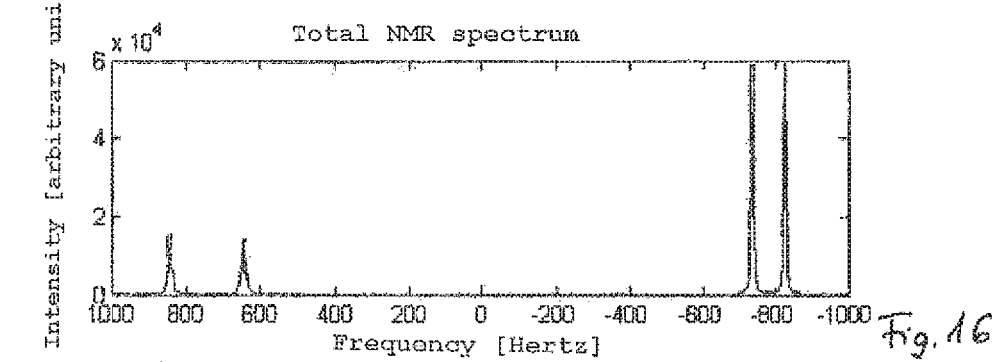
Figure 17:
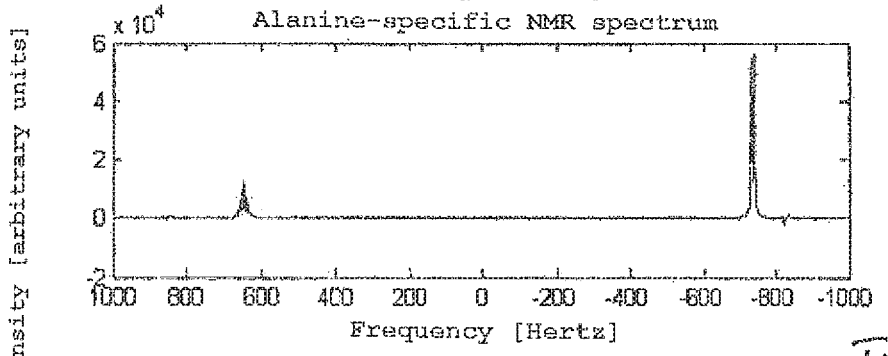

In the following, the invention is explained in greater detail as an example, using the drawing. This shows, in FIG. 1 a non-analyzable total NMR spectrum of a biofluid, FIG. 2 a total NMR spectrum of an analyte mixture consisting only of two analytes (alanine and lactate), FIG. 3 the time-dependent amplitude progression of the high-frequency pulse relative to the total NMR spectrum according to FIG. 2, FIG. 4 the time-dependent phase progression of the high-frequency pulse relative to the total NMR spectrum according to FIG. 2, FIG. 5 the NMR spectrum of the pure analyte alanine, FIG. 6 the time-dependent amplitude progression of a high-frequency pulse for alanine at the beginning of the iteration, FIG. 7 the related phase progression of the high-frequency pulse according to FIG. 6, FIG. 8 the total NMR spectrum according to FIG. 2 on a smaller scale, FIG. 9 the alanine-specific NMR spectrum on the basis of excitation with a high-frequency pulse according to FIGS. 6 and 7, FIG. 10 the time-dependent amplitude progression of a high-frequency pulse for alanine in the middle of the iteration, FIG. 11 the related phase progression of the high-frequency pulse according to FIG. 10, FIG. 12 the total NMR spectrum according to FIG. 2 on a smaller scale, FIG. 13 the alanine-specific NMR spectrum on the basis of excitation with a high-frequency pulse according to FIGS. 10 and 11, FIG. 14 the time-dependent amplitude progression of a high-frequency pulse for alanine at the end of the iteration, FIG. 15 the related phase progression of the high-frequency pulse according to FIG. 14, FIG. 16 the total NMR spectrum according to FIG. 2 on a smaller scale, and in FIG. 17 the alanine-specific NMR spectrum on the basis of excitation with a high-frequency pulse according to FIGS. 14 and 15.

In FIG. 1, a total NMR spectrum of a bio-fluid is shown as an example; it was obtained in a low-field NMR spectrometer. It is not difficult to recognize that such an NMR spectrum cannot be analyzed.

In order to nevertheless be able to use low-field NMR spectrometers for analysis of liquid analyte mixtures, the method according to the invention, as described above, is used.

Figure 2:
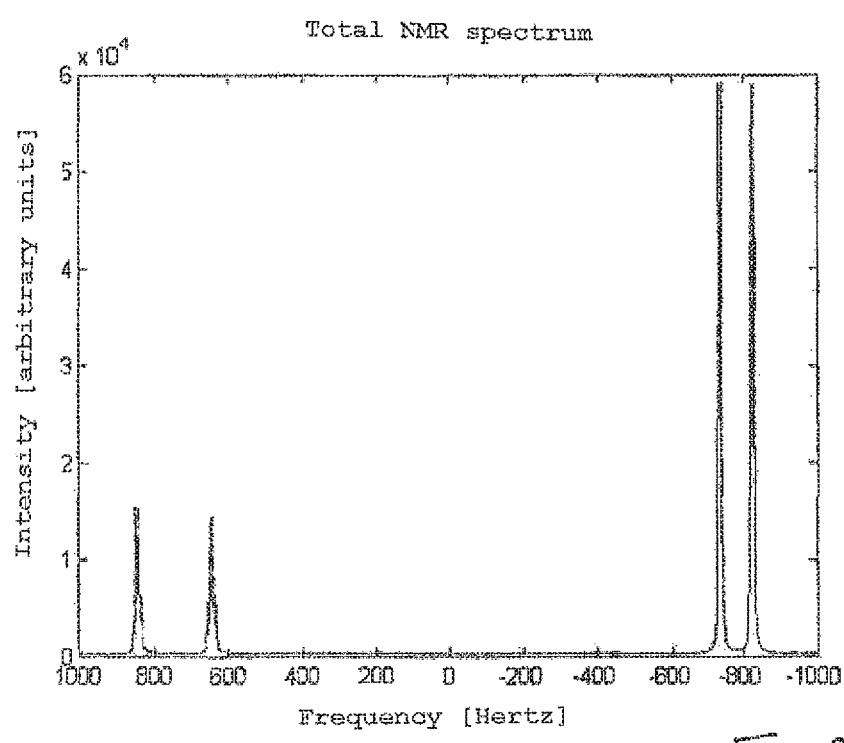

FIG. 2 shows a total NMR spectrum of an analyte mixture, which consists of only two analytes, namely lactate and alanine, in order to allow an easier explanation. This spectrum, shown in FIG. 2, could therefore already be reasonably evaluated fundamentally. Hereinafter, however, it is assumed, for an explanation of the method according to the invention, that the spectrum shown in FIG. 2 cannot be analyzed.

Figure 3:
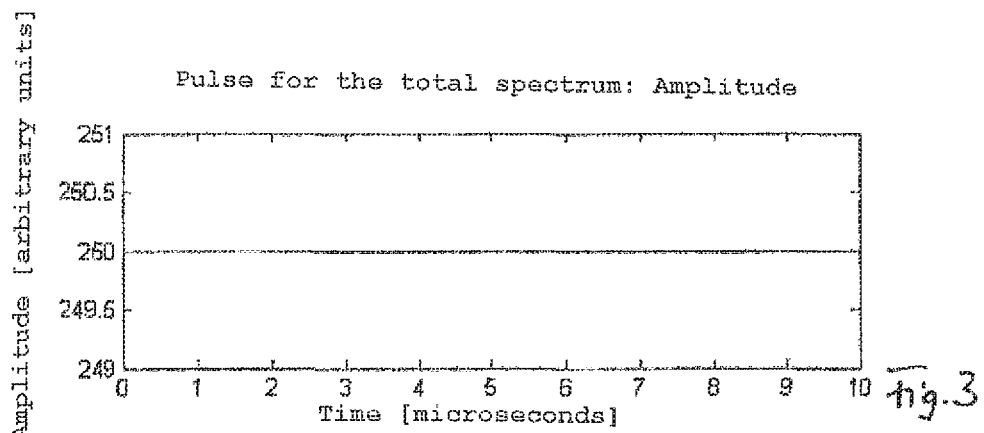
Figure 4:
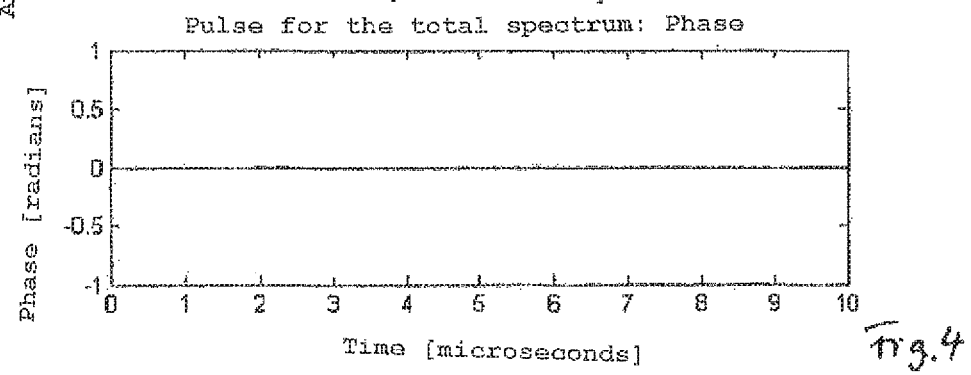

The spectrum shown in FIG. 2 comes about in that a liquid sample disposed in a low-field NMR spectrometer and consisting of only lactate and alanine has a high-frequency pulse applied to it, which is shown in FIGS. 3 and 4. For the intensity in FIG. 2, an "arbitrary unit" is selected; this is usual since the precise intensity (of a voltage) is very greatly dependent on the hardware (field intensity of the magnet, pre-amplifier) that is used for detection. Therefore, every NMR spectroscopist will measure a different voltage for one and the same pulse, depending on which device he/she is using.

Normally, the absolute frequencies in the NMR lie in the range of 5 MHz to approximately 1 GHz (radio waves to lower microwave range). In contrast, the differences in the frequencies between different NMR signals lie in the range of kHz. The frequency scales would therefore contain very large numbers, which differ only slightly and would be difficult to read. For this reason, a carrier frequency in the MHz range is subtracted from all the frequencies, and only the changes relative to this carrier frequency are represented. The carrier frequency is placed in the center of the spectrum, so that positive and negative frequencies occur for the "small" changes between the signals. Contrary to convention, the frequency scale runs from right to left, i.e. the positive frequencies are situated on the left side of the X axis. This has historical reasons and is used in this manner up to the present.

Figure 5:
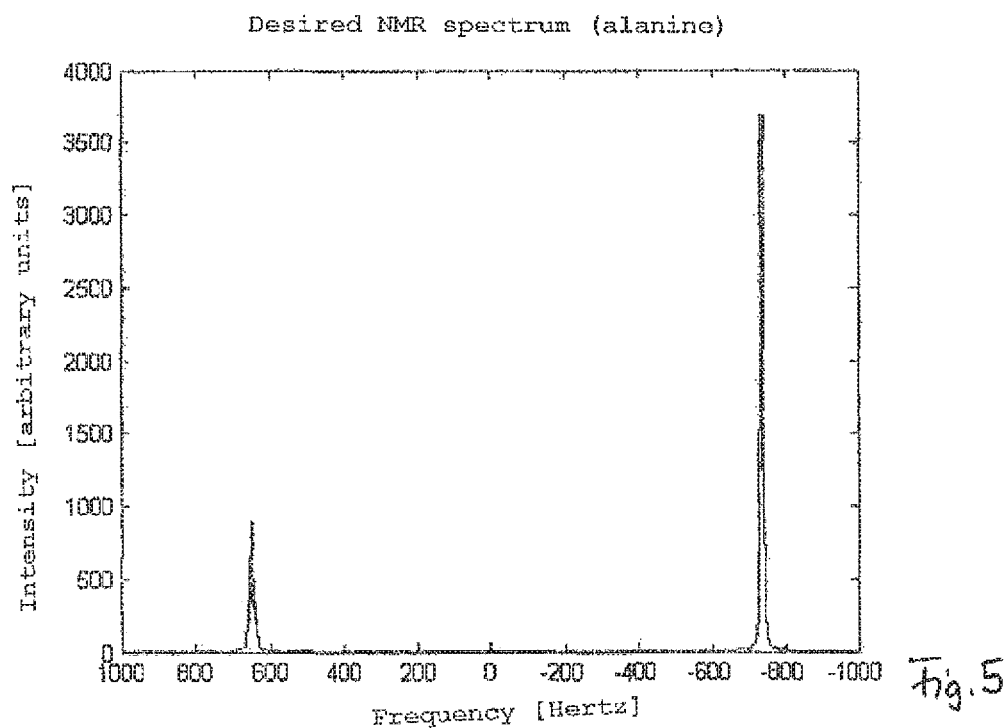

FIG. 5 shows the desired NMR spectrum for alanine. If, according to the invention, the liquid sample consisting only of lactate and alanine has a high-frequency pulse specific for alanine, i.e. a high-frequency pulse that excites only alanine, applied to it a low-field NMR spectrometer, then the NMR spectrum shown in FIG. 5 would occur if alanine is actually contained in the sample in a corresponding amount. In this regard, according to the invention, a high-frequency pulse specific for alanine is understood to mean, here, that the pulse is able to excite an entire series of frequency bands, specifically at all positions at which signals occur for alanine in the NMR spectrum.

In order to determine an analyte-specific NMR high-frequency pulse, in this case an alanine-specific pulse, the method of procedure is as follows:

An NMR experiment is fundamentally conducted as follows, in this regard: A high-frequency pulse typically having a length of 10 µs is applied to a coil that is wound around a glass tube that contains the analyte mixture (also called "sample"), using a high-frequency generator. As the result of the action of the pulse, a magnetic moment that changes over time is generated in the analyte mixture. By means of a suitable technical apparatus, the coil is changed from "transmission mode" to "reception mode." The magnetic moment of the sample, which changes over time, then induces a voltage in the coil, which is measured for approximately 500 ms as a function of time and digitalized using an analog-digital converter. After Fourier transformation of the digitalized time signal, a representation of the shape amplitude occurs as a function of the frequency; this is referred to as the NMR spectrum.

Without further provisions, the NMR spectrum contains the NMR signals of all the analytes or substances of the analyte mixture, in other words lactate and alanine according to FIG. 2.

What is sought is a high-frequency pulse that delivers only the NMR spectrum of one (freely selectable) substance of the mixture in an NMR experiment that is conducted on a mixture of multiple substances. For this purpose, the method of "optimal control" is used. This iterative numerical method optimizes a functional. This is understood to be an expression that is given a mathematical function and delivers a number in return. The goal of the algorithm is to iteratively maximize the functional. The function given to the functional is a quality function that compares the actual state of the pulse that has just been achieved (in other words the spectrum that the pulse actually delivers at the point in time of the calculation) with the reference state (in other words the spectrum that the pulse should ideally deliver). The functional delivers particularly large values if the actual state and the reference state agree. This would be the desired state in which the pulse generates precisely the NMR spectrum that is desired.

The reference state is established in such a manner that only the signals of the desired substance appear in the resulting NMR spectrum. This is always easily possible, because the NMR spectra of all substances of the mixture are known. For calculation of the actual state, the pulse is replaced with a histogram of about 200 rectangular pulses, which are very short (approximately 50 µs). In this case, the NMR spectrum that such a rectangular pulse generates can be calculated relatively easily. Such a calculation is known, for example from the journal Progress in NMR Spectroscopy, Vol. 16, pp. 163-192, 1983.

For calculation of the NMR spectrum that is generated by the total high-frequency pulse, all the rectangular pulses of the histogram must be considered successively. Calculation of the quality function then indicates how far the actual state is still removed from the reference state. If the quality function is not yet satisfactory, the amplitudes of the individual rectangular pulses of the histogram are changed, and a new iteration begins. The way in which the amplitudes of the 200 rectangular pulses must be changed is established by means of an analytical updating rule given within the scope of the algorithm. This updating rule ensures that the quality function and thereby the function grows in strictly monotonous manner with every iteration. The calculation is stopped after a number of iterations that must be established in advance by means of empirical tests, since there is no criterion that allows establishing a maximal number of iterations.

In FIGS. 5 to 17, determination of a high-frequency pulse that excites only alanine, in other words an alanine-specific pulse is shown as an example.

Figure 6:
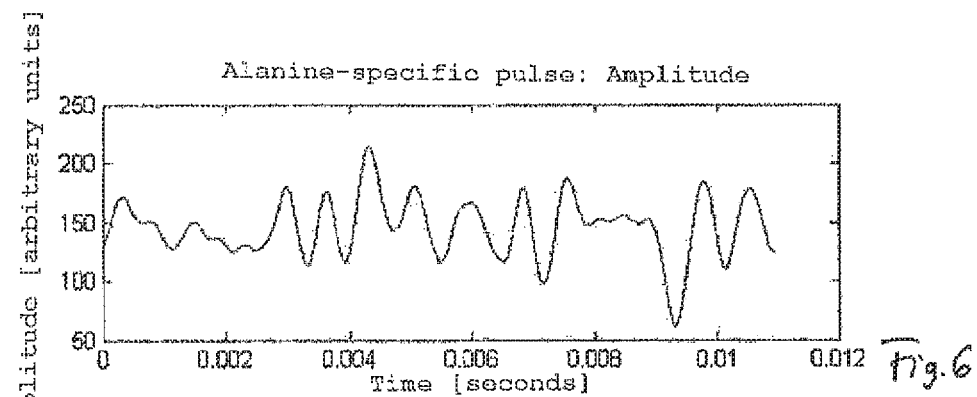
Figure 7:
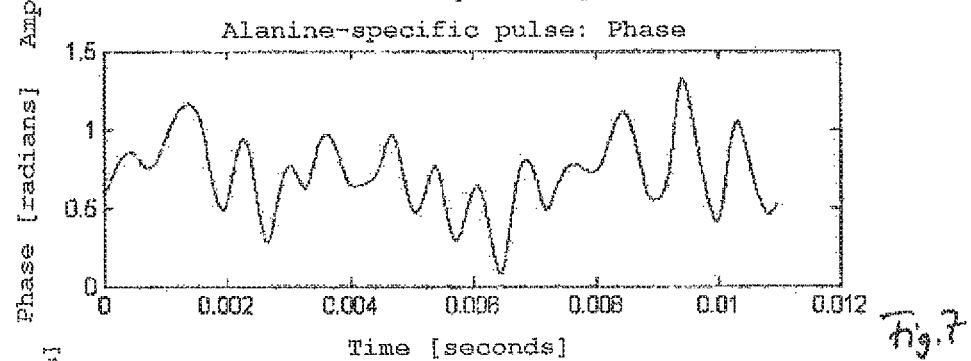
Figure 8:
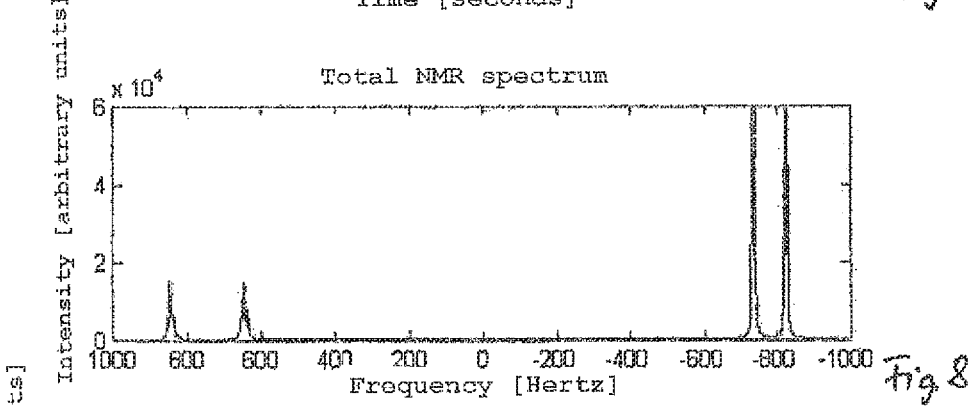
Figure 9:
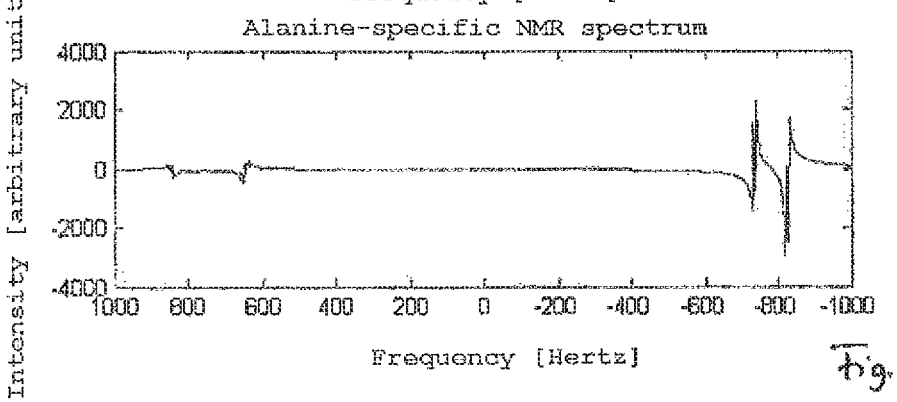

At the beginning of the iteration, an alanine-specific high-frequency pulse is used, for example according to FIGS. 6 and 7, which is still approximated relatively close to the high-frequency pulse for the total spectrum according to FIGS. 3 and 4. From this, an alanine-specific NMR spectrum that is still very poor, according to FIG. 9, is obtained, but this already differs from the total NMR spectrum according to Figure (or FIG. 2).

Figure 10:
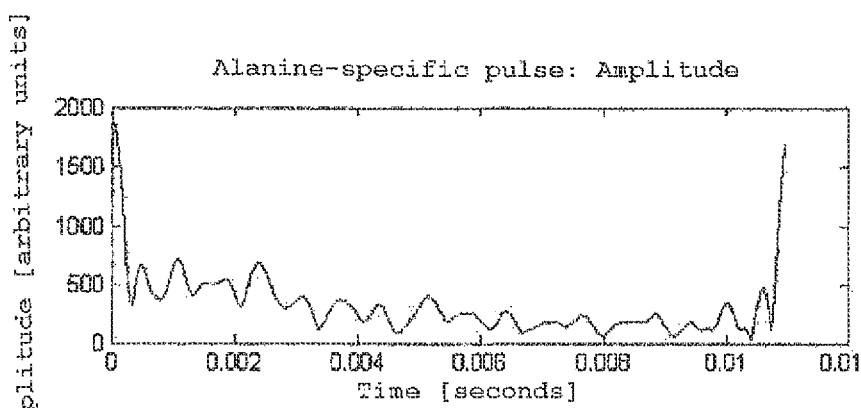
Figure 11:
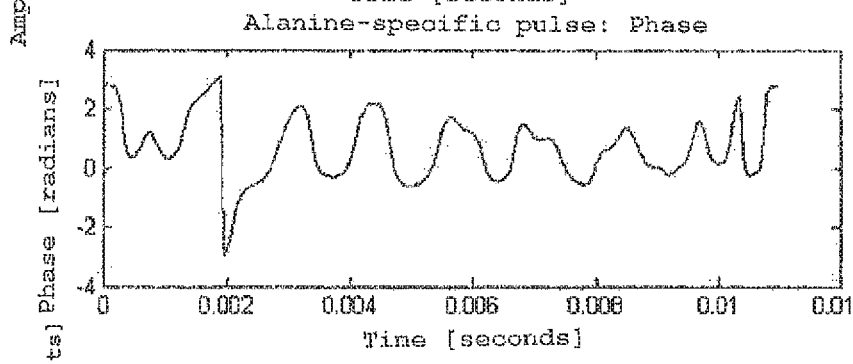

Subsequently, the alanine-specific high-frequency pulse is modified more and more; in FIGS. 10 and 11, an alanine-specific high-frequency pulse is shown in the middle of the iteration, as an example. This results in an alanine-specific NMR spectrum according to FIG. 13, which already clearly differs from the total NMR spectrum according to FIG. 12 (or FIG. 2), and is already developing in the direction of the desired alanine NMR spectrum according to FIG. 5, so to speak.

Figure 14:
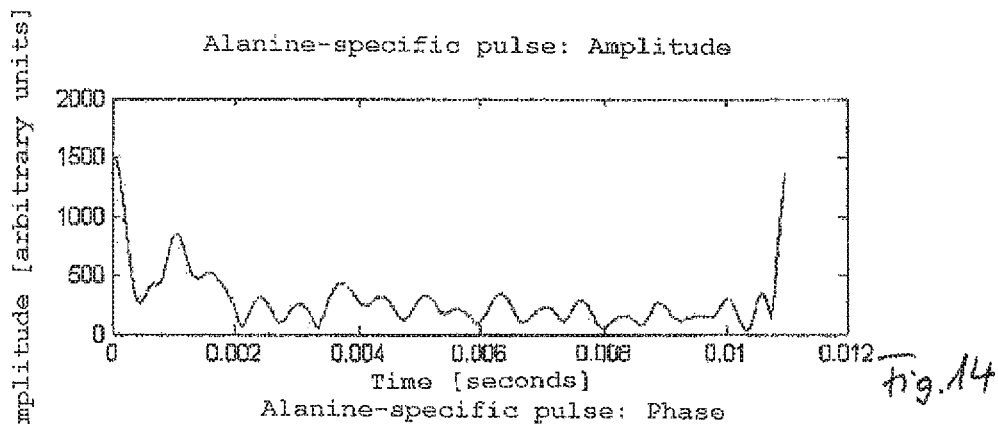
Figure 15:
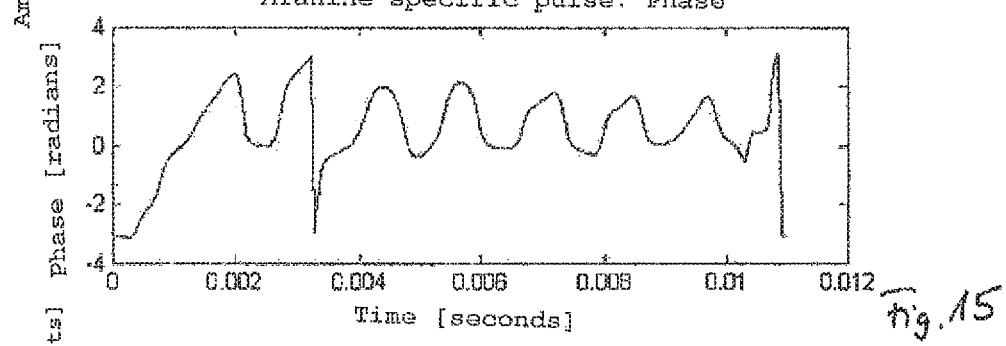

At the end of the iteration, an alanine-specific high-frequency pulse according to FIGS. 14 and 15 is obtained. This results in an alanine-specific NMR spectrum according to FIG. 17, which clearly differs from the total NMR spectrum according to FIG. 16 (or FIG. 2), and corresponds, to the greatest possible extent, to the desired alanine-specific NMR spectrum according to FIG. 5. Thereby a high-frequency pulse that is specific for alanine (FIGS. 14 and 15) is found, which is archived or stored in memory in the low-field NMR spectrometer. This high-frequency pulse, which is specific for alanine, is therefore a high-frequency pulse that is able to excite an entire series of frequency bands, specifically precisely at all positions at which signals for alanine appear in the NMR spectrum.

If a liquid sample is now inserted into a low-field NMR spectrometer, and if this sample is to be examined with regard to the presence and the amount of alanine, then alanine-specific high-frequency pulse stored in memory is used, and this pulse is applied to the sample. If alanine is present in the sample, an NMR spectrum that is typical for alanine occurs. If, in contrast, no alanine is contained in the sample, then nothing can be detected in the NMR spectrum other than noise signals, i.e. alanine cannot be detected.

In the same manner, specific high-frequency pulses are determined correspondingly for other analytes or substances. During investigation of a sample, in other words an analyte mixture, for different analytes, different analyte-specific high-frequency pulses are subsequently applied to the sample, wherein in each instance, an evaluation takes place in the meantime, i.e. the respective NMR spectrum is evaluated, and it is determined whether and in what concentration the respective analyte is present.

The invention claimed is:

1. A method for detection and quantification of individual analytes in liquid analyte mixtures, by means of NMR spectrometry, in which method a sample of the analyte mixture has a high-frequency pulse applied to it in an NMR spectrometer, and the resulting NMR spectrum is evaluated,
wherein
the sample of the analyte mixture is placed into a low-field NMR spectrometer, and at least one high-frequency pulse that excites only one specific analyte is applied to it.

2. The method according to claim 1,
wherein
the sample of the analyte mixture has multiple high-frequency pulses applied to it, one after the other, each pulse exciting only one specific analyte, wherein the resulting NMR spectrum is evaluated after every high-frequency pulse application.

3. The method according to claim 1,
wherein
the magnetic field of the low-field NMR spectrometer has a magnetic intensity between 0.1 and 3.0 T.

4. The method according to claim 1,
wherein
a high-frequency pulse that is specific to a respective analyte and excites only this analyte is determined and archived for a plurality of analytes.

5. The method according to claim 4,
wherein
the respective high-frequency pulse, which excites only one specific analyte, is determined in numerically iterative manner.

* * * * *